(12) United States Patent
Yoshida et al.

(10) Patent No.: US 11,247,330 B2
(45) Date of Patent: Feb. 15, 2022

(54) METHOD FOR TEACHING A TRANSPORTATION POSITION AND ALIGNMENT JIG

(71) Applicant: ASM IP Holding B.V., Almere (NL)

(72) Inventors: Hideki Yoshida, Nagaoka (JP); Masaei Suwada, Nagaoka (JP)

(73) Assignee: ASM IP Holding B.V., Almere (NL)

( * ) Notice: Subject to any disclaimer, the term of this patent is extended or adjusted under 35 U.S.C. 154(b) by 790 days.

(21) Appl. No.: 16/165,512

(22) Filed: Oct. 19, 2018

(65) Prior Publication Data

US 2020/0122320 A1   Apr. 23, 2020

(51) Int. Cl.
*B25J 15/00* (2006.01)
*B25J 9/16* (2006.01)
*H01L 21/68* (2006.01)
*H01L 21/687* (2006.01)
(Continued)

(52) U.S. Cl.
CPC .............. *B25J 9/163* (2013.01); *B25J 15/00* (2013.01); *H01L 21/67201* (2013.01); *H01L 21/681* (2013.01); *H01L 21/68707* (2013.01); *G05B 19/402* (2013.01); *G05B 2219/39548* (2013.01);
(Continued)

(58) Field of Classification Search
CPC .......... B25J 9/1694; B25J 15/00; B25J 9/163; H01L 21/68707; H01L 21/681; H01L 21/67201; H01L 21/67742; H01L 21/68; H01L 21/67167; H01L 21/67265; H01L 21/67389; H01L 21/67259; Y10T 279/26; G05B 2219/42129; G05B 19/402; G05B 2219/39548; G05B 19/41875; G05B 19/4184; G05B 2219/45031;
(Continued)

(56) References Cited

U.S. PATENT DOCUMENTS 6,377,870 B1 * 4/2002 Blaesing-Bangert ....................... H01L 21/67778 118/69
7,627,395 B2 * 12/2009 Sadighi ............. H01L 21/67259 700/245

(Continued)

FOREIGN PATENT DOCUMENTS

JP   2017-183647 A   10/2017

OTHER PUBLICATIONS

Yoshimi et al., Integrating real-time vision and manipulation, 1997, IEEE, p. 178-187 (Year: 1997).*

(Continued)

*Primary Examiner* — Marc McDieunel
(74) *Attorney, Agent, or Firm* — Studebaker & Brackett PC (57) ABSTRACT

Examples of a method for teaching a transportation position includes correcting the position of an alignment jig having a plurality of sloping surfaces relative to a susceptor pin projecting upwards from an upper surface of a susceptor by lowering a robot hand to bring one of the sloping surfaces into contact with the susceptor pin and causing the susceptor pin to slide on the sloping surfaces by virtue of an own weight of the aliment jig, detecting a position of the alignment jig before and after the positional correction of the alignment jig, and correcting a movement destination information by an amount corresponding to a difference between an initial position and a corrected position of the alignment jig.

11 Claims, 5 Drawing Sheets

(51) Int. Cl.
*H01L 21/67* (2006.01)
*G05B 19/402* (2006.01)

(52) U.S. Cl.
CPC ............... *G05B 2219/42129* (2013.01); *H01L 21/67167* (2013.01); *Y10T 279/26* (2015.01)

(58) Field of Classification Search
CPC ......... G05B 2219/37224; Y10S 901/02; Y10S 901/27; Y02P 90/02
See application file for complete search history.

(56) References Cited

U.S. PATENT DOCUMENTS

| | | | | |
|---|---|---|---|---|
| 8,185,242 | B2* | 5/2012 | Wong | H01L 21/68 700/254 |
| 8,459,922 | B2* | 6/2013 | Hosek | H01L 21/67294 414/217 |
| 8,666,551 | B2* | 3/2014 | Takizawa | H01L 21/67265 700/259 |
| 8,924,118 | B2* | 12/2014 | Shin | B25J 9/02 701/70 |
| 10,593,575 | B2* | 3/2020 | Miner | H01L 21/68 |

OTHER PUBLICATIONS

Skotheim et al., A flexible 3D object localization system for industrial part handling, 2012, IEEE, p. 3326-3333 (Year: 2012).*
Lee et al., Kinematic calibration system of robot hands using vision cameras, 2013, IEEE, p. 175-177 (Year: 2013).*

* cited by examiner

METHOD FOR TEACHING A TRANSPORTATION POSITION AND ALIGNMENT JIG

TECHNICAL FIELD

Examples are described which relate to a method for teaching a transportation position and an alignment jig.

BACKGROUND

In processing a substrate on a susceptor, a robot hand needs to be used to place the substrate to be processed in a predetermined position on the susceptor. For example, the substrate needs to be placed at the center of the susceptor. Depending on a type of processing to be carried out, the substrate needs to be placed without a deviation of several millimeters. To place the substrate in the predetermined position on the susceptor, a process called teaching is performed in which details of a transportation carried out by the robot hand are defined. The transportation details include, for example, information on the central position of the susceptor.

In the conventional teaching, alignment jigs are set individually on the robot hand and in a chamber, and the center of the susceptor and the center of the chamber are determined using the alignment jigs or through a visual confirmation. For example, a teaching for transporting a substrate to the center of the chamber is performed with the center of the susceptor aligned with the center of the chamber. In this case, the alignment of the center of the chamber with the center of the susceptor may fail as a result of a level control of the susceptor. Thus, the alignment needs to be confirmed visually.

The chamber needs to be opened to the atmosphere to perform the conventional teaching. This requires the temperature in the chamber to be decreased and increased. Opening the chamber to the atmosphere requires a long operation time before and after it although the teaching time is relatively short. The operation time can be reduced by performing the teaching while holding the operating state of the chamber without opening it to the atmosphere. The operating state of the chamber means a state where a substrate, such as a wafer, can be processed in the chamber or a state close to such a state. For example, when the chamber is in the operating state, a high temperature and a vacuum are maintained in the chamber.

SUMMARY

Some examples described herein may address the above-described problems. Some examples described herein may provide a method for teaching a transportation position and an alignment jig which can reduce the long operation time.

In some examples, a method for teaching a transportation position includes detecting a position of an alignment jig having sloping surfaces on a bottom surface as an initial position of the alignment jig by a sensor while the alignment jig is being moved from a home position to a susceptor by a robot hand based on predetermined movement destination information, positioning the alignment jig on the susceptor by the robot hand, correcting the position of the alignment jig relative to a susceptor pin projecting upwards from an upper surface of the susceptor by lowering the robot hand to bring one of the sloping surfaces into contact with the susceptor pin and causing the susceptor pin to slide on the sloping surface by virtue of an own weight of the aliment jig, raising the robot hand in order for the robot hand to support the alignment jig which is supported by the susceptor pin, detecting a corrected position of the alignment jig by the sensor while the alignment jig is being returned to the home position by the robot hand, and correcting the movement destination information by an amount corresponding to a difference between the initial position and the corrected position.

DETAILED DESCRIPTION

A method for teaching a transportation position and an alignment jig according to some examples will be described by reference to accompanying drawings. Like reference numerals will be given to like or corresponding constituent elements, so that a repetition of a like description may be omitted from time to time.

Figure 1:
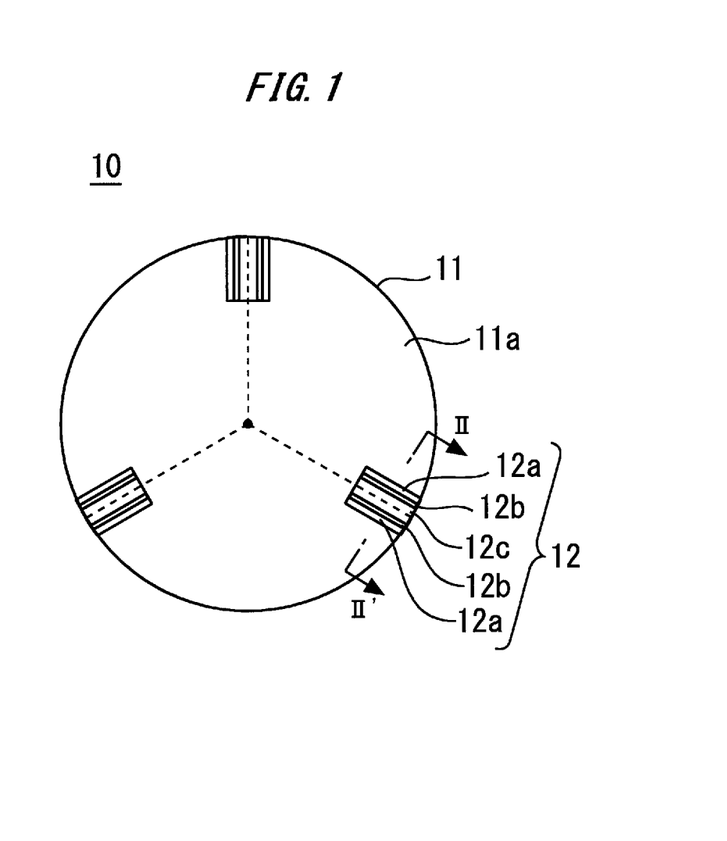
FIG. 1 is a bottom view of an alignment jig.

FIG. 1 is a bottom view of an alignment jig 10 according to some examples, illustrating an example of a configuration of the alignment jig 10. The alignment jig 10 may includes a circular disc-shaped base portion 11 and slide portions 12 fixed to the base portion 11. A bottom surface 11a of the base portion 11 constitutes a flat surface. The base portion 11 has a substantially circular shape, and this allows the alignment jig 10 to have an external shape which is almost the same as that of a 300 mm wafer, for example.

Three slide portions 12 are provided at equal intervals along a circumference of the base portion 11. The number of slide portions 12 can be increased or decreased. The slide portions 12 may be provided along an outer edge of the base portion 11 or may be provided so as to be spaced away from the outer edge.

The slide portion 12 includes a bottom surface 12a, sloping surfaces 12b and a groove 12c. The groove 12c is formed substantially into a straight line which extends in a direction from a center towards the outer edge of the base portion 11. For example, a plurality of grooves 12c can be provided radially in planar view. FIG. 1 illustrates three grooves 12c which are provided radially. Side walls of the groove 12c constitute the sloping surfaces 12b. Thus, two sloping surfaces 12b, facing each other, are provided on one slide portion 12. In other words, the two sloping surfaces 12b are provided to face each other on inner walls of the groove 12c. The slide portion 12 has the sloping surfaces 12b on the bottom surface thereof in the way described above.

Resins, ceramics or carbon-based materials can be adopted as a material for the alignment jig 10. Materials can be selected which are not affected by a temperature at which a teaching is performed on the alignment jig 10. The base portion 11 and the slide portions 12 may be formed of different materials. For example, the base portion 11 and the slide portions 12 can be formed of different materials which are selected from resins, ceramics or carbon-based materials. Known materials can be selected so that a dynamic friction coefficient of the slide portion 12 is smaller than a dynamic friction coefficient of the base portion 11.

Figure 2:
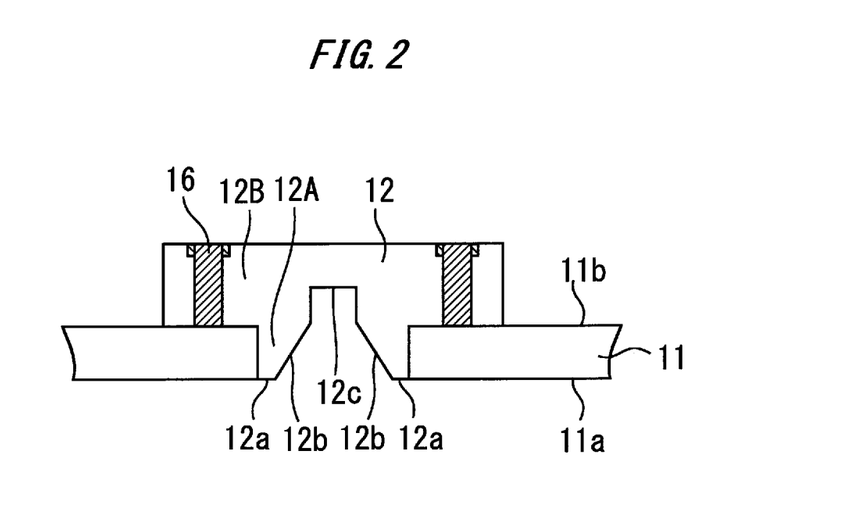
FIG. 2 is a sectional view taken along a line II-II' in FIG. 1.

FIG. 2 is a sectional view taken along a line II-II' in FIG. 1. The slide portion 12 includes a first portion 12A and a second portion 12B. The first portion 12A is provided within an opening in the base portion 11. The second portion 12B is located above the base portion 11.

The slide portion 12 is fixed to the base portion 11 by being fastened to the base portion 11 with screws 16 which are screwed through openings formed in the second portion 12B. In this example, the base portion 11 and the slide portion 12 are described as being separate components. However, the base portion 11 and the slide portion 12 can be formed into an integral unit.

A sum of a thickness of the base portion 11 and a thickness of the second portion 12B constitutes a thickness of the alignment jig 10. When the alignment jig 10 is too thick, a robot hand cannot transport the alignment jig 10. Due to this, the sum of the thickness of the base portion 11 and the thickness of the second portion 12B may be 10 mm or smaller.

Figure 3:
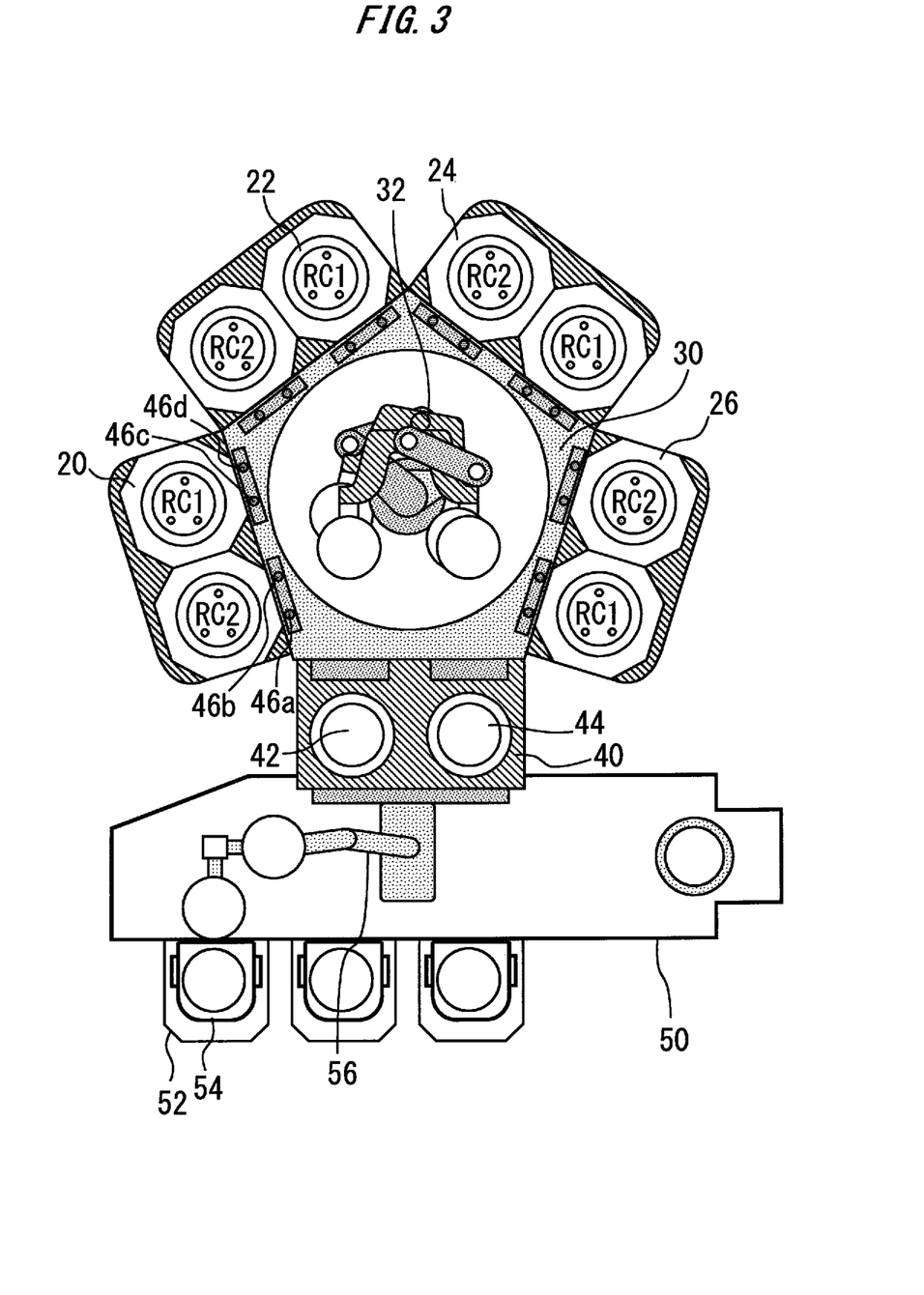
FIG. 3 illustrates an example of a configuration of a substrate processing system.

FIG. 3 illustrates an example of a configuration of a substrate processing system. Four DCMs 20, 22, 24, 26 are modules configured to process a substrate. Each module includes two reactor chambers. The two reactor chambers are denoted as RC1 and RC2. In the reactor chambers, for example, a plasma treatment is applied to a substrate. One reactor chamber includes one susceptor. According to an example, three susceptor pins can be raised and lowered for one susceptor. The susceptor pins projecting from the susceptor receive a substrate, and when the susceptor is raised, causing the susceptor pins to be retracted into the susceptor, the substrate rests on the susceptor. The reactor chambers are an example of a processing chamber where a substrate is processed.

The four DCMs 20, 22, 24, 26 connect to a wafer handling chamber 30. Gate valves may be provided at a boundary between the four DCMs 20, 22, 24, 26 and the wafer handling chamber 30 so that the DCMs 20, 22, 24, 26 can be coupled to and decoupled from the wafer handling chamber 30. A robot hand 32 is provided in the wafer handling chamber 30. The robot hand 32 is, for example, a multi joint robot. The robot hand 32 holds a substrate to be transported by securely sucking it through electrostatic or vacuum force. The robot hand 32 is, for example, an end effector.

A load lock chamber 40 is connected to the wafer handling chamber 30 via, for example, a gate valve. For example, two stages 42, 44 can be provided in the load lock chamber 40 for a substrate to rest on them. The robot hand 32 transports a substrate between the stage 42 or the stage 44 and any one of the susceptors.

An EFEM 50 is connected to the load lock chamber 40. The EFEM 50 includes load ports 52. The load ports 52 are provided so that a hoop 54 installing a wafer or configured to install a wafer can rest on them. A robot hand 56 provided in the EFEM 50 plays a role of transporting a substrate between the hoop 54 and the stages 42, 44.

Sensors 46a, 46b, 46c, 46d are provided in the vicinity of a boundary between the DCMs 20, 22, 24, 26 and the wafer handling chamber 30 to detect the position of a substrate in transportation. The sensors 46a, 46b detect the position of a substrate which is removed from the load lock chamber 40 by the robot hand 32 and the position of a substrate which is transported to the RC2 by the robot hand 32. The sensors 46c, 46d detect the position of a substrate which is removed from the load lock chamber 40 by the robot hand 32 and the position of a substrate which is transported to the RC1 by the robot hand 32. The sensors 46a, 46b, 46c, 46d each include, for example, a laser emitting element and a receiving optic.

Figure 4:
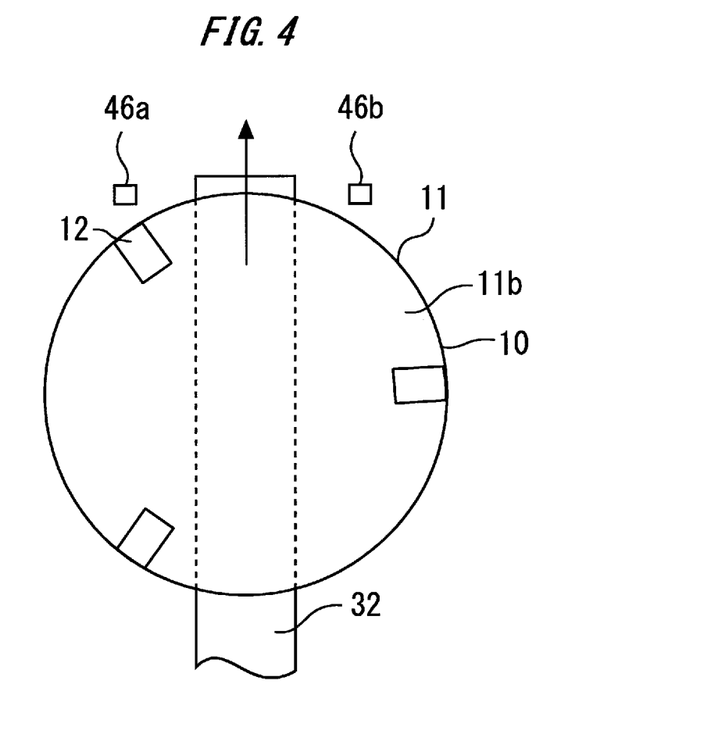
FIG. 4 illustrates a method for detecting a substrate using the sensors.

FIG. 4 illustrates an example of method for detecting a substrate using the sensors 46a, 46b. In FIG. 4, a detection of the alignment jig 10, having the same outside diameter as that of a substrate, will be described. The robot hand 32 securely sucks the alignment jig 10 for transportation. The sensor 46a includes the laser emitting element configured to emit a laser beam in a direction from a near side to a far side of FIG. 4 or in an opposite direction and the receiving optic configured to receive the laser beam emitted from the laser emitting element. The sensor 46b can have the same configuration as that of the sensor 46a. Laser beams emitted from the laser emitting elements of the sensors 46a, 46b are interrupted by the alignment jig 10 as the transportation of the alignment jig 10 is progressing in the direction illustrated by an arrow in FIG. 4. When the interruption by the alignment jig 10 ends, the receiving optic resumes the reception of the laser beam.

Figure 5:
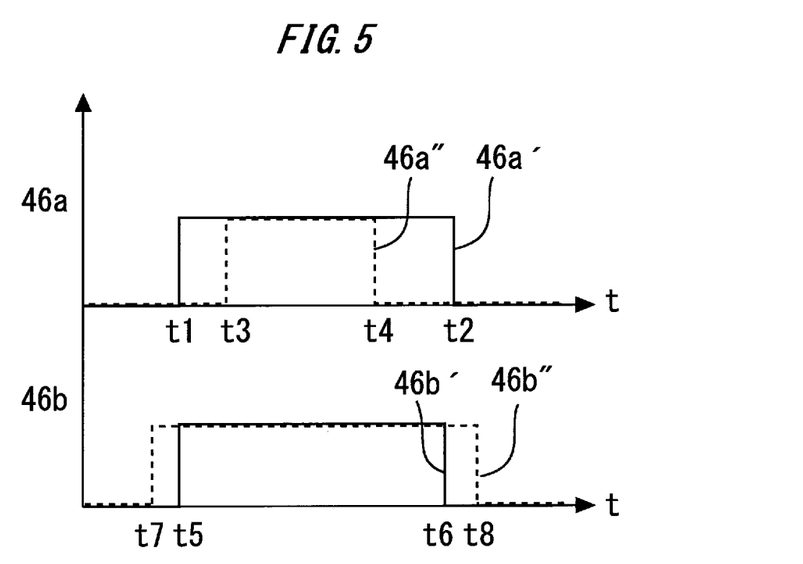
FIG. 5 illustrates waveforms indicating detection patterns by the sensors.

FIG. 5 illustrates waveforms indicating detection patterns by the sensors. A detection level becomes high when the receiving optic receives a laser beam, whereas the detection level becomes low when the receiving optic receives no laser beam. Detection patterns 46a', 46b' indicated by solid lines are each an example of a detection pattern resulting when the alignment jig 10 is moved from the load lock chamber 40 to the susceptor. Detection patterns 46a", 46b" are each an example of a detection pattern resulting when the alignment jig 10 is moved from the susceptor to the load lock chamber 40.

Figure 6:
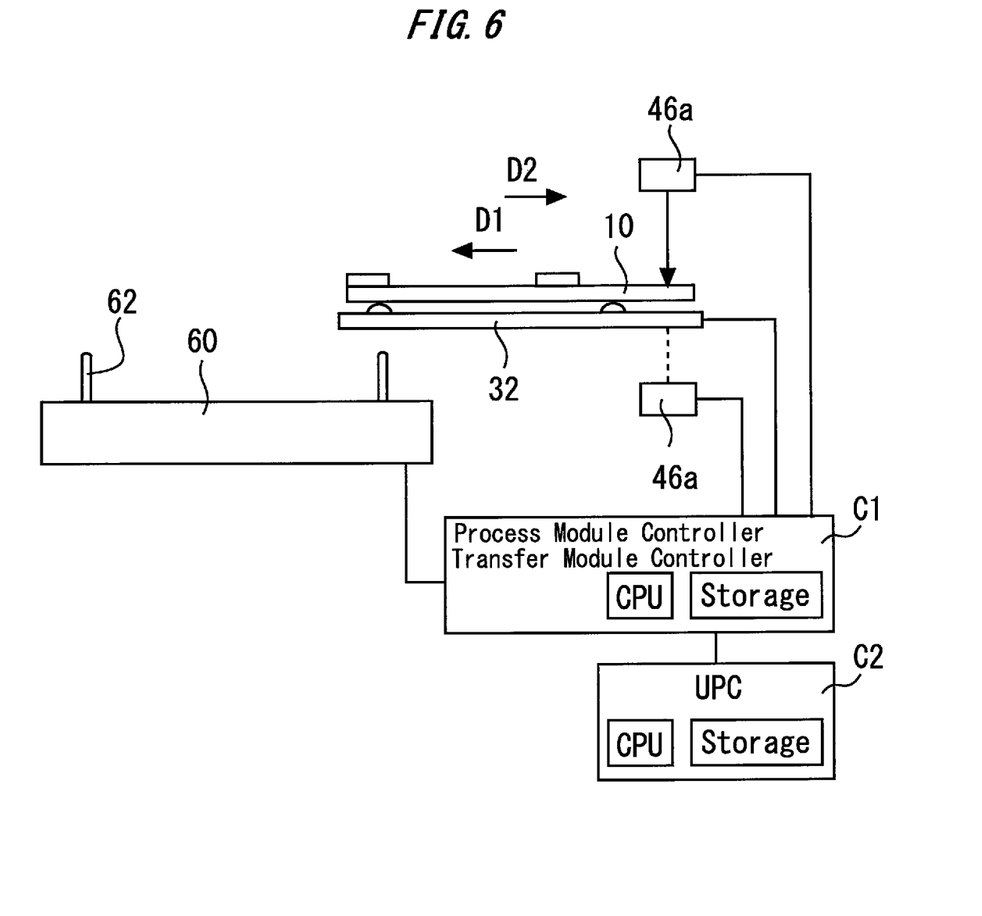
FIG. 6 illustrates a transportation of the alignment jig.

Then, a method for teaching a transportation position using the alignment jig 10 described above will be described below. Firstly, the alignment jig 10 is moved from a home position to the susceptor using the robot hand 32. FIG. 6 illustrates a transportation of the alignment jig 10. As FIG. 6 illustrates, the robot hand 32 and a susceptor 60 can be controlled by a module controller C1. In some examples, the module controller C1 controls the robot hand 32 and the susceptor 60 based on a command from a UPC C2. The data detected by the sensors including the sensor 46a, 46b, 46c, 46d are transferred to the module controller C1 possibly via the robot hand 32.

The home position means a position where a pre-process substrate and a post-process substrate are stocked. For example, in the system configuration shown in FIG. 3, the stages 42, 44 of the load lock chamber 40 can constitute the home position. The robot hand 32 moves the alignment jig 10 from the home position to the susceptor based on information on a movement destination which is predetermined in the PMC or UPC. According to an example, the movement destination information is defined by a swiveling angle of the robot arm and a distance over which the robot arm travels based on the home position. In the example illustrated in FIG. 6, the robot hand 32 moves the alignment jig 10 in a direction indicated by an arrow D1.

A position of the alignment jig 10 in the midst of movement is detected as an initial position of the alignment jig 10 by the sensors. The sensors 46a, 46b are used when the alignment jig 10 is moved to the RC2, whereas the sensors 46c, 46d are used when the alignment jig 10 is moved to the RC1. For example, the waveforms indicated by the solid lines in FIG. 5 are obtained by the detection of the initial position. Edge positions of the waveforms constitute timings at which the levels of the waveforms are switched between high and low, and these edge positions show the position of the alignment jig. In this way, the robot hand 32 locates the alignment jig 10 on the susceptor 60.

Figure 7:
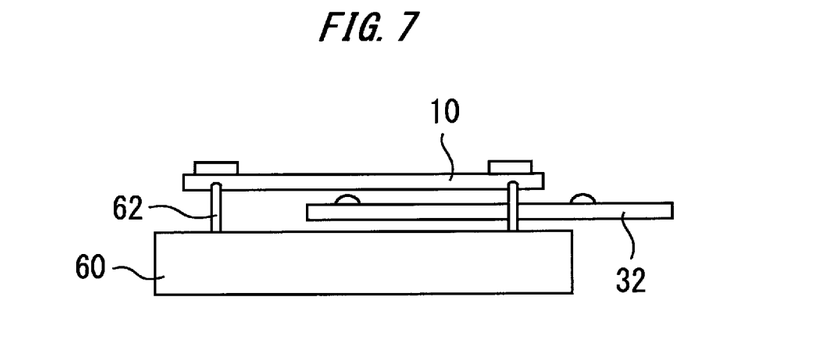
FIG. 7 illustrates a state where the robot hand has been lowered.
Figure 8:
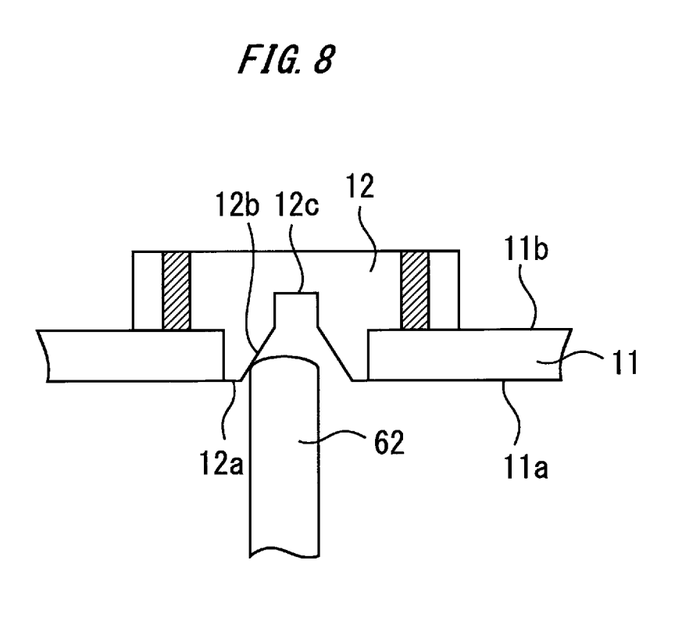
FIG. 8 illustrates a state where the susceptor pin has come into contact with the sloping surface.
Figure 9:
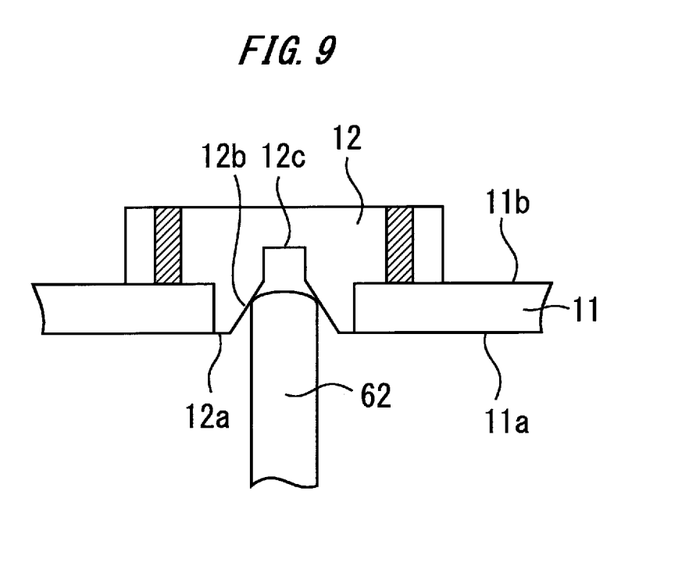
FIG. 9 illustrates a state where the susceptor pin has come into contact with the two sloping surfaces.

Next, the robot hand 32 is lowered to bring the sloping surfaces 12b into contact with susceptor pins 62 projecting upwards from an upper surface of the susceptor 60. FIG. 7 illustrates a state where the robot hand 32 has been lowered. Lowering the robot hand 32 causes the robot hand 32 to leave the alignment jig 10, whereby the sloping surfaces 12b and the susceptor pins 62 come into contact with each other. FIG. 8 illustrates a state where the susceptor pin 62 has come into contact with the sloping surface 12b. The susceptor pin 62 comes into contact with one of the two facing sloping surfaces 12b. Then, the susceptor pin 62 slides on the sloping surface 12b by virtue of the own weight of the alignment jig 10 and comes into contact with both the two facing sloping surfaces 12b. FIG. 9 illustrates a state where the susceptor pin 62 has come into contact with the two sloping surfaces 12b. The position of the alignment jig 10 relative to the susceptor pin 62 is corrected as a result of the susceptor pin 62 sliding on the sloping surface 12b. Specifically speaking, the position of the alignment jig 10 resulting immediately after the robot hand 32 is lowered is corrected as a result of the susceptor pin 62 sliding on the sloping surface 12b.

The susceptor pins 62 slide on the sloping surfaces 12b in the way described above in the three slide portions 12 provided on the alignment jig 10. Depending on the position of the alignment jig 10, one or two of the susceptor pins 62 slide in one or two of the slide portions 12. Correcting the position of the alignment jig 10 in the way described above positions the alignment jig 10 at the center of the susceptor, for example.

Next, the robot hand 32 is raised to support the alignment jig 10 which is supported by the susceptor pins 62. The position of the alignment jig 10 relative to the robot hand 32 is now corrected from the position of the alignment jig 10 when it is transported from the home position to the susceptor as a result of the position of the alignment jig 10 being corrected as described above.

Next, the robot hand 32 returns the alignment jig 10 to the home position. Then, the sensors 46a, 46b detect the post-correction or corrected position of the alignment jig 10 while the alignment jig 10 is returning to the home position. FIG. 5 illustrates examples of waveforms, indicated by broken lines, which the sensors 46a, 46b obtain during the return of the alignment jig 10 to the home position. Correcting the position of the alignment jig 10 in the way described above causes the waveforms indicated by the broken lines to differ from the waveforms, indicated by the solid lines, which the sensors 46a, 46b obtain while the alignment jig is transported from the home position to the susceptor. The alignment jig 10 or a substrate is located in a predetermined position on the susceptor based on information on the corrected position of the alignment jig 10 which the sensors 46a, 46b obtain in the process of returning the alignment jig 10 to the home position. This "predetermined position" is, for example, the center of the susceptor.

Next, the movement destination information is corrected by an amount corresponding to a difference between the initial position and the corrected position which are obtained by the sensors. Specifically speaking, the movement destination information is corrected so that the waveforms of the corrected position indicated by the broken lines in FIG. 5 for example can be realized in the next transportation of the alignment jig or a substrate. The teaching of the transportation position ends when the movement destination information has been corrected. The corrected movement destination information is stored in the PMC C1 or the UPC C2 for use from the next transportation of a substrate onward. Transporting a substrate based on the corrected movement destination information enables the substrate to be rested accurately at the center of the susceptor, for example.

In some examples, the series of processes performed until the corrected position is detected can be performed in a vacuumed space while the temperature of the susceptor 60 is held in a range of 100° C. to 400° C. Performing the processes necessary for the teaching with the susceptor 60 being heated to that temperature range enables the substrate to be processed immediately after completion of the teaching. Forming the alignment jig 10 of a material capable of withstanding such high temperatures enables the processes described above to be performed at the high temperatures. Other values may be used in other examples. For example, mounting a camera on the alignment jig will prevent the processes from being performed at those high temperatures.

The teaching method using the alignment jig 10 described above does not require the opening of the chamber to the atmosphere. Moreover, the teaching method can be executed while the chamber is kept operating. For example, when the processes necessary for the teaching are performed with the susceptor held in the temperature range of 100° C. to 400° C., forming the alignment jig 10 of a resin can suppress the deformation of the alignment jig 10. Additionally, the processes until the corrected position is detected can be performed with the susceptor being heated to a temperature exceeding 400° C. As this occurs, adopting a ceramic or carbon-based material for the material of the alignment jig 10 can suppress the deformation of the alignment jig 10.

The angle of the sloping surfaces 12b relative to the bottom surface 12a of the slide portion 12 and the area of the sloping surfaces 12a can be optimized depending on the initial movement destination information and the magnitude of correction of the same information. Providing the plurality of grooves 12c radially in planar view enables the processes necessary for the teaching to be performed even though the susceptor is caused to thermally expand or contract. Specifically speaking, the susceptor thermally expands in a direction from the center towards the outer edge of the susceptor and thermally contracts in a direction from the outer edge towards the center of the susceptor. Thus, providing the grooves 12c radially so as to be centered at the center of the susceptor enables the teaching to be carried out even on the susceptor which thermally expands or contracts.

Although the groove 12c is formed into the straight line, the groove 12c may be formed into a circular cone. As this occurs, a resulting circular conical groove may be sized in consideration of thermal expansion or contraction of the susceptor such an extent that the sloping surface can be brought into contact with the susceptor pin even though the susceptor thermally expands or contracts. Forming the sloping surface to slope moderately enables the sloping surface to be brought into contact with the susceptor pin even though the initial position of the alignment jig 10 deviates greatly from the ideal position. However, there are fears that the susceptor pin does not slide on the moderate sloping surface, and to avoid this, the sloping surface can be formed of a material on which the susceptor pin slides well. For example, the dynamic friction coefficient of the slide portion 12 is made smaller than the dynamic friction coefficient of the base portion 11.

The invention claimed is:

1. A method for teaching a transportation position comprising:
    detecting a position of an alignment jig having sloping surfaces on a bottom surface as an initial position of the alignment jig by a sensor while the alignment jig is being moved from a home position to a susceptor by a robot hand based on predetermined movement destination information;
    positioning the alignment jig on the susceptor by the robot hand;
    correcting the position of the alignment jig relative to a susceptor pin projecting upwards from an upper surface of the susceptor by lowering the robot hand to bring one of the sloping surfaces into contact with the susceptor pin and causing the susceptor pin to slide on the sloping surface by virtue of an own weight of the aliment jig;
    raising the robot hand in order for the robot hand to support the alignment jig which is supported by the susceptor pin;
    detecting a corrected position of the alignment jig by the sensor while the alignment jig is being returned to the home position by the robot hand; and
    correcting the movement destination information by an amount corresponding to a difference between the initial position and the corrected position.

2. The method according to claim 1, wherein the processes performed until the corrected position is detected are performed with the susceptor being heated to a temperature ranging from 100° C. to 400° C.

3. The method according to claim 2, wherein a material for the alignment jig is a resin.

4. The method according to claim 1, wherein the processes performed until the corrected position is detected are performed with the susceptor being heated to a temperature exceeding 400° C.

5. The method according to claim 4, wherein a material for the alignment jig is a ceramic or carbon-based material.

6. The method according to claim 1, wherein the alignment jig comprises a substantially circular disc-shaped base portion and a slide portion having the sloping surfaces.

7. The method according to claim 6, wherein a dynamic friction coefficient of the slide portion is smaller than a dynamic friction coefficient of the base portion.

8. The method according to claim 6,
    wherein a groove is formed on the slide portion in a direction from a center towards an outer edge of the base portion, and
    wherein the sloping surfaces are provided to face each other on inner walls of the groove.

9. The method according to claim 8, wherein a plurality of the grooves are formed radially in planar view.

10. The method according to claim 1, wherein the processes performed until the corrected position is detected are performed in a vacuumed space.

11. The method according to claim 1,
    wherein the home position resides in a load lock chamber, and
    wherein the susceptor resides in a processing chamber.

* * * * *